(12) United States Patent
Lin et al.

(10) Patent No.: US 8,299,589 B2
(45) Date of Patent: Oct. 30, 2012

(54) PACKAGING DEVICE OF IMAGE SENSOR

(75) Inventors: Wen Chang Lin, Taoyuan County (TW); Chao Chang Hu, Taoyuan County (TW); Zheng Hui Hsieh, Taoyuan County (TW); Chih Jung Hung, Taoyuan County (TW)

(73) Assignee: TDK Taiwan, Corp. (TW)

( * ) Notice: Subject to any disclaimer, the term of this patent is extended or adjusted under 35 U.S.C. 154(b) by 160 days.

(21) Appl. No.: 12/804,698

(22) Filed: Jul. 26, 2010

(65) Prior Publication Data

US 2012/0018830 A1   Jan. 26, 2012

(51) Int. Cl.
*H01L 23/057* (2006.01)

(52) U.S. Cl. ..... 257/680; 438/98; 438/64; 257/E31.117; 257/E21.5; 257/730

(58) Field of Classification Search .................. 438/64, 438/98; 257/E31.117, E21.5, 680, 730
See application file for complete search history.

(56) References Cited

U.S. PATENT DOCUMENTS

| | | | | |
|---|---|---|---|---|
| 5,952,714 A * | 9/1999 | Sano et al. | ..................... | 257/680 |
| 6,696,738 B1 * | 2/2004 | Tu et al. | ........................ | 257/433 |
| 2003/0057359 A1 * | 3/2003 | Webster | ........................ | 250/216 |
| 2004/0179249 A1 * | 9/2004 | Hsieh et al. | .................... | 358/505 |
| 2005/0048692 A1 * | 3/2005 | Hanada et al. | ................ | 438/106 |
| 2006/0093352 A1 * | 5/2006 | Webster et al. | ............... | 396/529 |
| 2008/0079829 A1 * | 4/2008 | Choi et al. | ..................... | 348/294 |
| 2008/0099866 A1 * | 5/2008 | Chang et al. | ................... | 257/433 |
| 2008/0280389 A1 * | 11/2008 | Wang et al. | ..................... | 438/73 |
| 2009/0102002 A1 * | 4/2009 | Chia et al. | ...................... | 257/433 |
| 2009/0166785 A1 * | 7/2009 | Camacho et al. | .............. | 257/433 |
| 2009/0320908 A1 * | 12/2009 | Botkin et al. | .................. | 136/251 |
| 2010/0127341 A1 * | 5/2010 | Kawazu et al. | ................ | 257/432 |

\* cited by examiner

*Primary Examiner* — George Fourson, III

(57) ABSTRACT

A packaging device of an image sensor includes a supporting seat and the image sensor. The supporting seat is a hollow frame having a predetermined thickness, a first surface, a second surface, and an inner edge receding from the second surface toward the first surface to form a recessed step. Plural contacts in the recessed step and in the outer periphery of the supporting seat are electrically connected by plural electrical connection structures. The image sensor has an active surface set on the recessed step by a flip-chip packaging technique. The image sensor also has plural conductive ends electrically connected to the contacts in the recessed step. An insulating material covers an inactive surface of the image sensor and fills the gap between the recessed step of the supporting seat and the image sensor to provide dust-proofness, shock resistance, and prevention against static electricity and leakage of light.

11 Claims, 16 Drawing Sheets

PACKAGING DEVICE OF IMAGE SENSOR

BACKGROUND OF INVENTION

1. Field of the Invention

The present invention relates to a packaging device of an image sensor. More particularly, the present invention relates to a packaging device of an image sensor, wherein the image sensor is set on a recessed step by a flip-chip packaging technique and is electrically connected to a plurality of electrical connection structures on a supporting seat, and wherein the gap between the recessed step and the image sensor is filled by an insulating material so as to effectively increase production efficiency and reduce product thickness.

2. Description of the Prior Art

With the rapid development of technology, substantial advances have been made in information and electronic products, and the components of such products have become increasingly thinner and smaller. Nowadays, it is an important development trend for electronic products to feature enhanced user-friendliness and integrated functionality as well as compactness, portability, convenience of use, and an ergonomic and fashionable design. For instance, cell phones, personal digital assistants (PDAs) and laptop computers have been successfully integrated with digital cameras. Nevertheless, it is a major goal in the industry to further downsize the finished products, to simplify the manufacturing processes, and to enable easier assembly.

Please refer to FIG. 1 for a conventional packaging device of an image sensor. As shown in the drawing, a packaging device of an image sensor 11 is connected with a lens module 9 and includes the image sensor 11, a substrate 12, and a plurality of metal wires 13. The image sensor 11 is provided on the substrate 12 and is electrically connected thereto by the metal wires 13. The lens module 9 is also provided on the substrate 12 and has a lower portion formed as a cavity 91. The cavity 91 covers and surrounds the image sensor 11 to protect not only the image sensor 11 but also the metal wires 13 connected to the substrate 12. A glass cover plate 92 is provided in the cavity 91 above the image sensor 11 so as for the image sensor 11 to capture images from outside through the glass cover plate 92 and a lens set 93 preset in the lens module 9. The substrate 12 is connected to the circuit board 10 of another electronic device by solder balls 8 provided below the substrate 12.

In the conventional packaging device described above, the image sensor 11 is electrically connected to the substrate 12 by wire bonding with the metal wires 13, which is a complex and laborious process. Moreover, it is difficult to fix the lens module 9 at the precise position on the substrate 12. Therefore, not only is a complicated assembly procedure required, but also the thickness of the finished product cannot be further reduced.

SUMMARY OF INVENTION

The first object of the present invention is to provide a packaging device of an image sensor, wherein the image sensor is disposed on a recessed step formed in the hollow portion of a hollow and step-shaped supporting seat and is electrically connected to a plurality of electrical connection structures on the supporting seat so as to reduce the height of the packaging device.

It is another object of the present invention to provide a packaging device of an image sensor, wherein the supporting seat is formed with a projection by injection molding, thus allowing a lens module to be precisely positioned on the packaging device while being connected thereto. With the projection, positioning errors can be minimized to enable convenient and rapid assembly.

It is a further object of the present invention to provide a packaging device of an image sensor, wherein the image sensor is packaged in a step-shaped recess of a supporting seat with an insulating material which protects the packaging device against electromagnetic or electrostatic interference and prevents leakage of light.

1. A packaging device of an image sensor, the packaging device comprising:

a supporting seat formed as a hollow frame of a predetermined thickness, the supporting seat having a first surface and a second surface, the hollow frame of the supporting seat having an inner edge receding from the second surface toward the first surface to form a recessed step, the supporting seat provided with a plurality of electrical connection structures for providing electrical connection between a plurality of contacts provided in the recessed step and a plurality of contacts provided on an outer periphery of the supporting seat;

the image sensor having an active surface and an inactive surface, wherein the active surface of the image sensor enters the supporting seat through the second surface and is placed on the recessed step of the supporting seat such that a plurality of conductive ends peripherally provided on the active surface are electrically connected to the electrical connection structures on the recessed step;

a transparent cover plate provided on a side of the image sensor where the active surface is located; and an insulating material for covering the inactive surface of the image sensor and filling a gap between the recessed step of the supporting seat and the image sensor.

2. The packaging device of claim 1, wherein the transparent cover plate is one of infrared filter glass, plain glass, anti-reflection glass, and blue glass; electrical connection between the active surface and the conductive ends of the image sensor is implemented by one of conductive adhesive, solder paste, and solder balls; the supporting seat is made of one of glass reinforced epoxy, polyimide, resin, poly(p-phenylene oxide), and a ceramic substrate; and the transparent cover plate is bonded by a bonding agent to one of the first surface of the supporting seat and a hollow portion centrally provided on the first surface of the supporting seat.

3. The packaging device of claim 1, wherein the electrical connection structures are metal leads, the supporting seat coupled with the metal leads by casting or injection molding, and wherein the recessed step has a vertical depth greater than or equal to a thickness of the image sensor.

4. The packaging device of claim 1, wherein the packaging device is packaged by a packaging mold comprising a first mold having a first mold cavity and a second mold having a second mold cavity, the image sensor and the supporting seat being received in the first and second mold cavities, the packaging mold provided with at least a feed hole through which an injection device injects the insulating material into the packaging mold.

5. The packaging device of claim 4, wherein the at least a feed hole is provided on the first mold, communicates with the first mold cavity, and corresponds in position to the recessed step of the supporting seat, so as for the insulating material injected by the injection device to enter the first mold cavity through the at least a feed hole, cover the inactive surface of the image sensor, and fill the gap between the recessed step of the supporting seat and the image sensor.

6. The packaging device of claim 5, wherein the at least a feed hole is provided on the first mold and the second mold and in communication with the first mold cavity and the second mold cavity, respectively, the second mold cavity provided therein with at least a groove such that, when the insulating material injected by the injection device enters the second mold cavity through the feed hole(s) of the second mold, at least a projection is formed on the first surface of the supporting seat, the at least a projection surrounding a periphery of the transparent cover plate.

7. The packaging device of claim 6, wherein the first surface of the supporting seat is provided with at least a through hole, the at least a through hole corresponding in position to the feed hole(s) of the second mold, being rivet-shaped, and communicating with the recessed step of the supporting seat such that, when the insulating material injected by the injection device enters the second mold cavity through the feed hole(s) thereof, the insulating material passes through the at least a through hole and flows onto the recessed step of the supporting seat and into the first mold cavity, thereby covering the inactive surface of the image sensor, filling the gap between the recessed step of the supporting seat and the image sensor, and filling up the at least a through hole.

8. The packaging device of claim 1, wherein the packaging device is connected with a lens module, the lens module disposed on the first surface of the hollow frame, the first surface formed with a projection for engaging with and positioning a connecting end in a lower portion of the lens module such that an axis of a lens set installed in the lens module corresponds in position to a center of an image sensing region of the image sensor.

9. The packaging device of claim 1, wherein the electrical connection structures are composed of a plurality of metal leads formed by stamping or etching a thin metal plate, each said metal lead having an end bent and embedded in the recessed step of the supporting seat and serving as a contact for electrical connection with the image sensor, each said metal lead having an opposite end bent and embedded in an outer periphery of the second surface of the supporting seat and configured for electrical connection with an external electronic device.

10. The packaging device of claim 1, wherein the supporting seat is a printed circuit board, and the electrical connection structures are composed of plural layers of printed circuits in the printed circuit board.

11. The packaging device of claim 1, wherein the recessed step of the supporting seat is protrudingly provided with a spacer end for separating the insulating material on the recessed step from an image sensing region of the image sensor and thereby preventing the insulating material from entering and contaminating the image sensing region.

BRIEF DESCRIPTION OF THE DRAWINGS

The invention as well as a preferred mode of use, further objects, and advantages thereof will be best understood by referring to the following detailed description of certain illustrative embodiments in conjunction with the accompanying drawings, wherein.

DETAILED DESCRIPTION OF THE PREFERRED EMBODIMENT

Figure 1:
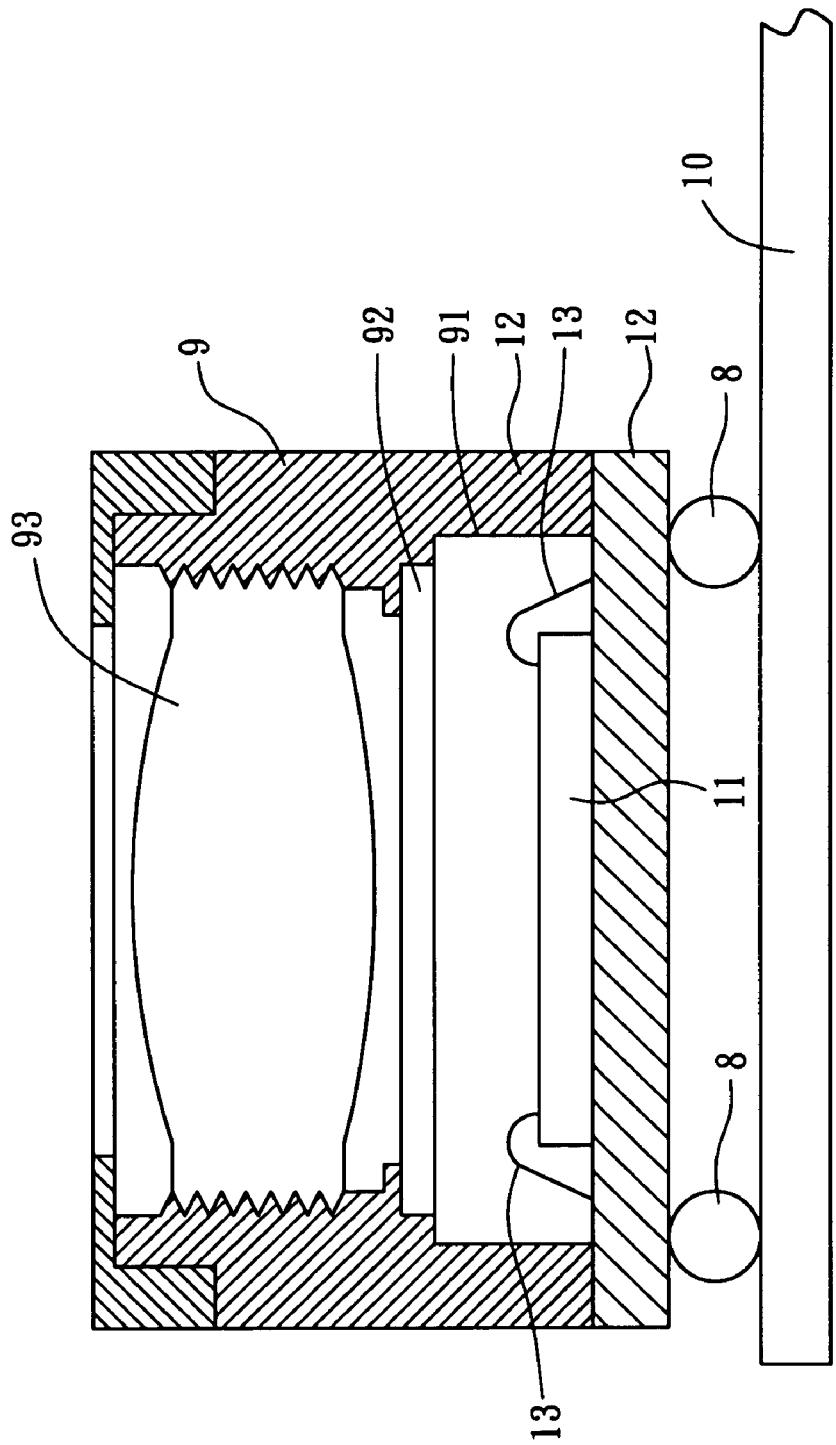
FIG. 1 is a sectional view of a conventional packaging device of an image sensor.
Figure 2:
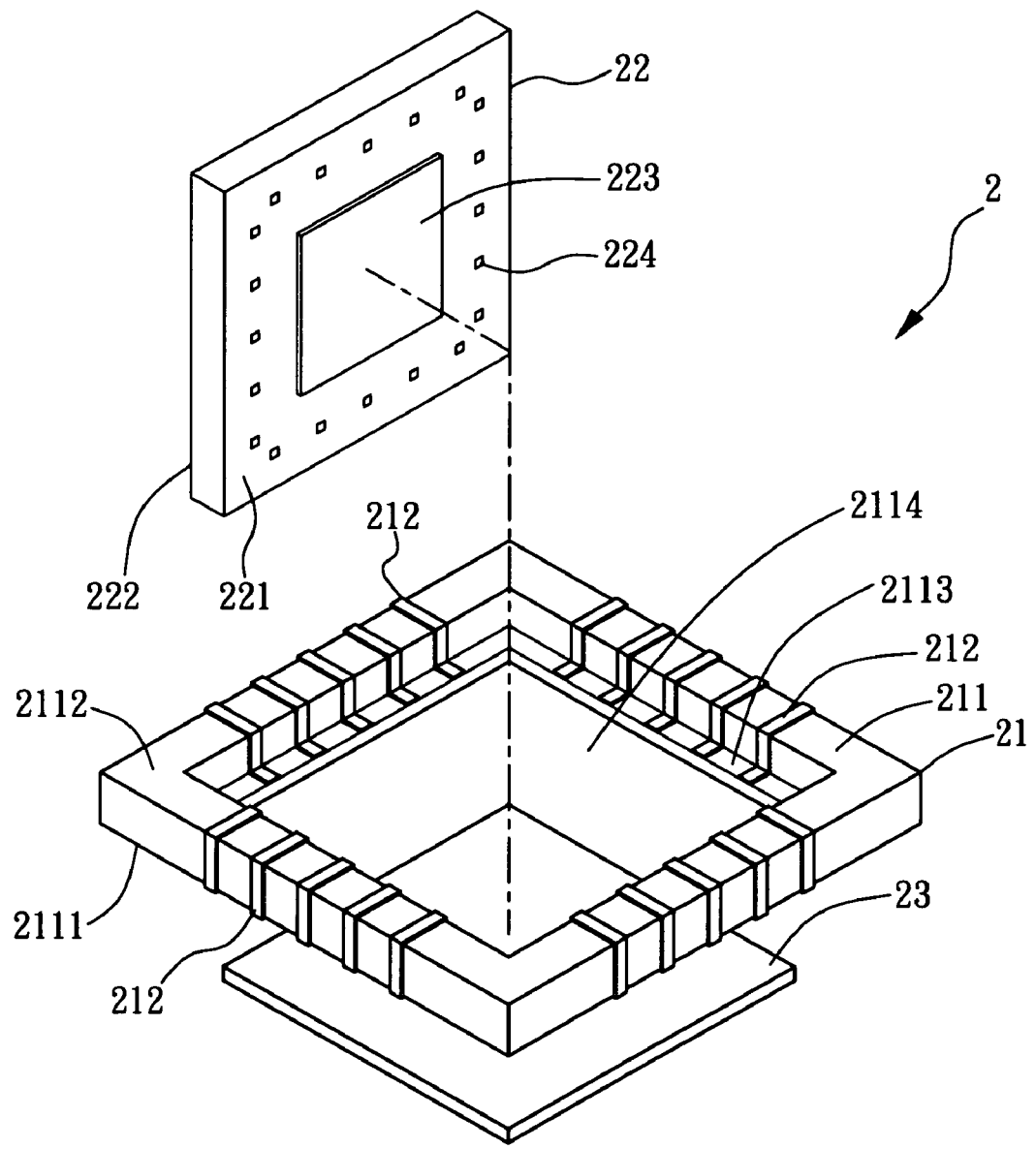
FIG. 2 is an exploded perspective view of a packaging device of an image sensor according to a first preferred embodiment of the present invention.
Figure 3:
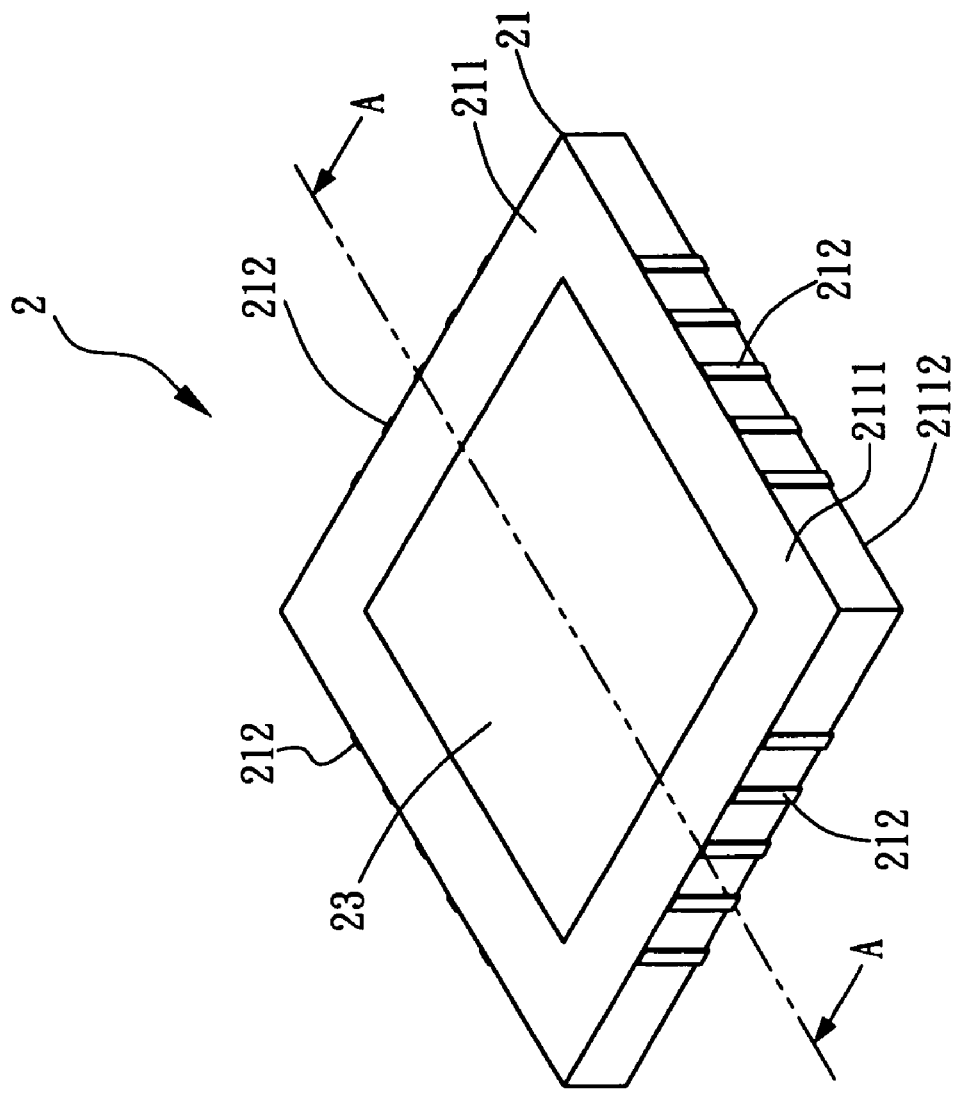
FIG. 3 is an assembled perspective view of the packaging device in the first preferred embodiment of the present invention.
Figure 4:
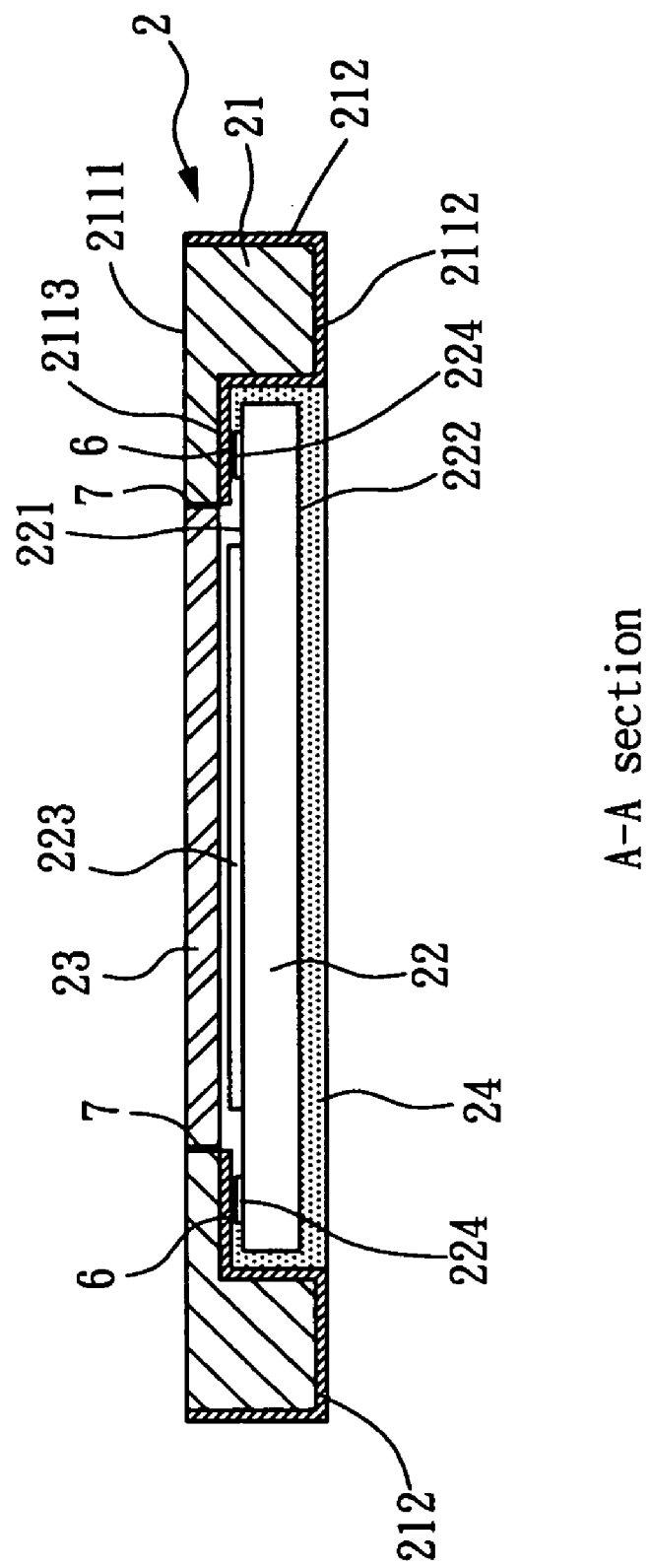
FIG. 4 is a sectional view taken along line A-A of FIG. 3.

Referring to FIGS. 2 to 4, in the first preferred embodiment of the present invention, a packaging device 2 of an image sensor 22 includes a supporting seat 21, a transparent cover plate 23, and an insulating material 24 in addition to the image sensor 22. The supporting seat 21 includes a hollow frame 211 and a plurality of electrical connection structures. In the first preferred embodiment of the present invention, the electrical connection structures are a plurality of metal leads 212. The hollow frame 211 has a first surface 2111, a second surface 2112, a recessed step 2113, and a hollow portion 2114. The image sensor 22 has an active surface 221, an inactive surface 222, an image sensing region 223, and a plurality of conductive ends 224.

The supporting seat 21 is made by casting or injection molding, using a lead frame as an insert, such that the hollow frame 211 has a predetermined thickness and is coupled with the metal leads 212 (i.e., the first embodiment of the electrical connection structures) of the lead frame. The hollow frame 211 has a step-shaped central inner edge which recedes from the second surface 2112 toward the first surface 2111 of the supporting seat 21 to form the recessed step 2113. The area enclosed by the recessed step 2113 generally corresponds in size to the active surface 221 of the image sensor 22. The supporting seat 21 is made of one of glass reinforced epoxy (e.g., FR-4 and FR-5), polyimide (PI), BT resin, poly(p-phenylene oxide) (PPO), and a ceramic substrate.

The image sensor 22 is configured for capturing images from outside and is usually a charge coupled device (CCD) or a complementary metal-oxide-semiconductor (CMOS) image sensing device.

The metal leads 212, which are in the form of planar strips, are substantially radially arranged around and embedded in the outer periphery of the hollow frame 211, are bent and embedded in the second surface 2112, and are further bent and embedded in the recessed step 2113. The metal leads 212 are formed by stamping or etching a thin metal plate and are one of copper, aluminum, alloys thereof, and other conductive metals. Each metal lead 212 has one end bent and embedded in the recessed step 2113 of the supporting seat 21 and serving as a contact for electrical connection with the image sensor 22. The other end of each metal lead 212 is bent and embedded in the outer periphery of the second surface 2112 of the supporting seat 21 and serves as a contact for electrical connection with another electronic device.

An appropriate difference of height is created between the recessed step 2113 and the second surface 2112. Thus, when the image sensor 22 is set on the recessed step 2113 by a flip-chip packaging technique, not only is the active surface 221 of the image sensor 22 set on the recessed step 2113, but also the conductive ends 224 of the image sensor 22 are respectively and electrically connected by a conductive material 6 to one ends of the metal leads 212 bent and embedded in the recessed step 2113, thereby reducing the risk of short-circuit during bridging. The conductive ends 224 are aluminum pads arranged around the image sensing region 223.

The image sensing region 223 surrounded by the conductive ends 224 is exposed at the center of the first surface 2111 of the supporting seat 21. In other words, the image sensing region 223 is exposed at the center of the hollow portion 2114 of the hollow frame 211. The conductive material 6 is one of conductive adhesive, solder paste, and solder balls.

Figure 5:
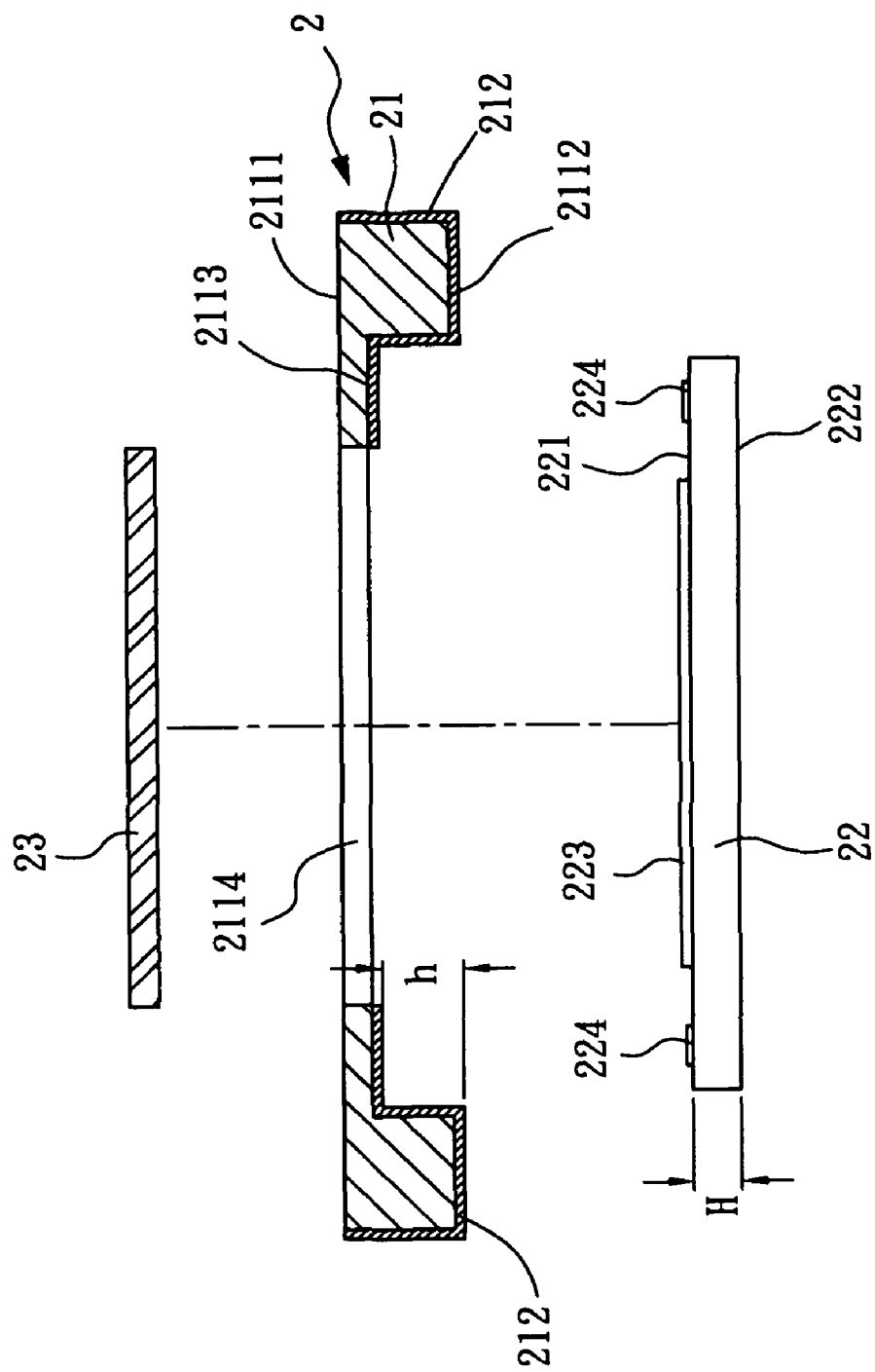
FIG. 5 is an exploded sectional view of the packaging device according to the first preferred embodiment of the present invention.

Referring to FIG. 5 in conjunction with FIG. 4, the recessed step 2113 of the supporting seat 21 has a vertical depth h greater than or equal to the thickness H of the image sensor 22. Using a flip-chip packaging technique, the active surface 221 of the image sensor 22 can be easily set on the recessed step 2113 formed in the hollow frame 211 of the supporting seat 21, such that the image sensing region 223 of the image sensor 22 corresponds in position to the hollow portion 2114 centrally provided in the hollow frame 211. The insulating material 24 is provided on the inactive surface 222 of the image sensor 22 to cover and seal the inactive surface 222. The gap between the recessed step 2113 of the supporting seat 21 and the image sensor 22 is also filled with the insulating material 24. The insulating material 24 has a shielding effect and is therefore capable of preventing electromagnetic interference (EMI) and protecting the image sensor 22 in the supporting seat 21 from external shock.

The transparent cover plate 23 is disposed above and covers the active surface 221 of the image sensor 22 and is set in the hollow portion 2114 centrally provided on the first surface 2111 of the hollow frame 211. A bonding agent 7 applied to the periphery of the transparent cover plate 23 fixedly bonds the transparent cover plate 23 to the hollow portion 2114 of the supporting seat 21, thus allowing the transparent cover plate 23 to protect the image sensing region 223 of the image sensor 22 from contamination by outside dust particles. The transparent cover plate 23 is one of infrared filter glass, plain glass, anti-reflection glass, and blue glass.

Figure 4A:
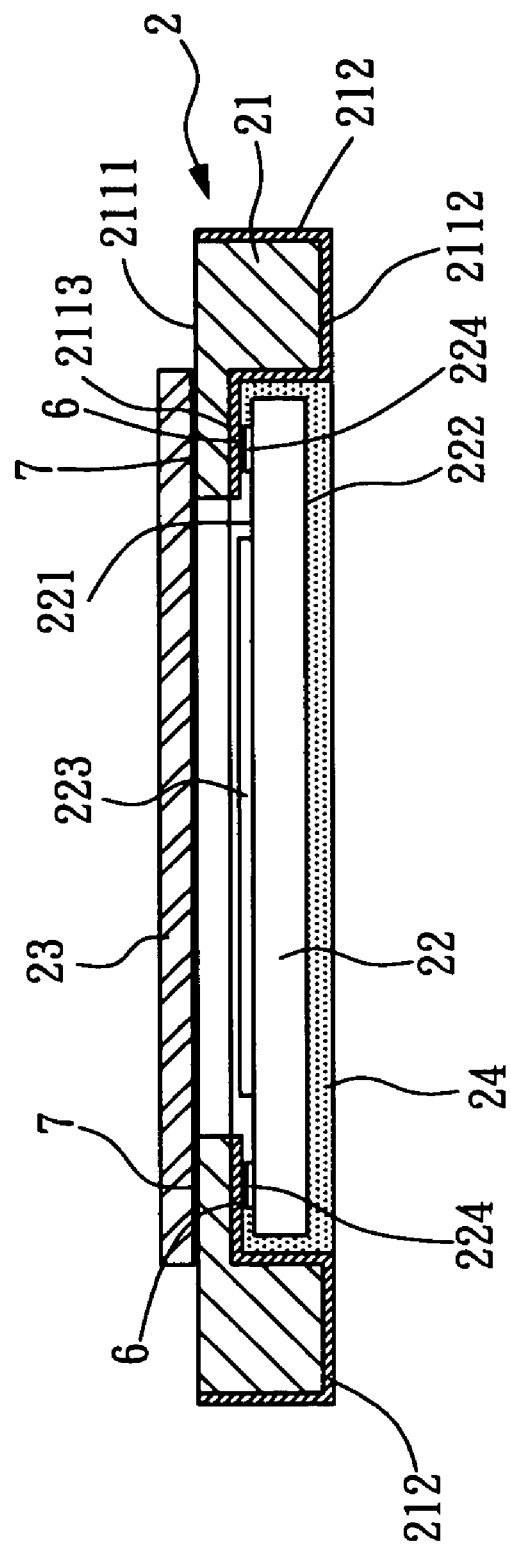
FIG. 4A is a sectional view showing another assembly mode of the glass cover plate in the packaging device according to the first preferred embodiment of the present invention.

FIG. 4A shows another assembly mode of the glass cover plate in the packaging device of the first preferred embodiment of the present invention. The assembly mode shown in FIG. 4A is different from that of the glass cover plate 23 shown in FIG. 4 in that the transparent cover plate 23 in FIG. 4A, which is slightly larger than the hollow portion 2114, is fixedly bonded to the first surface 2111 of the supporting seat 21 by the bonding agent 7.

Figure 6A:
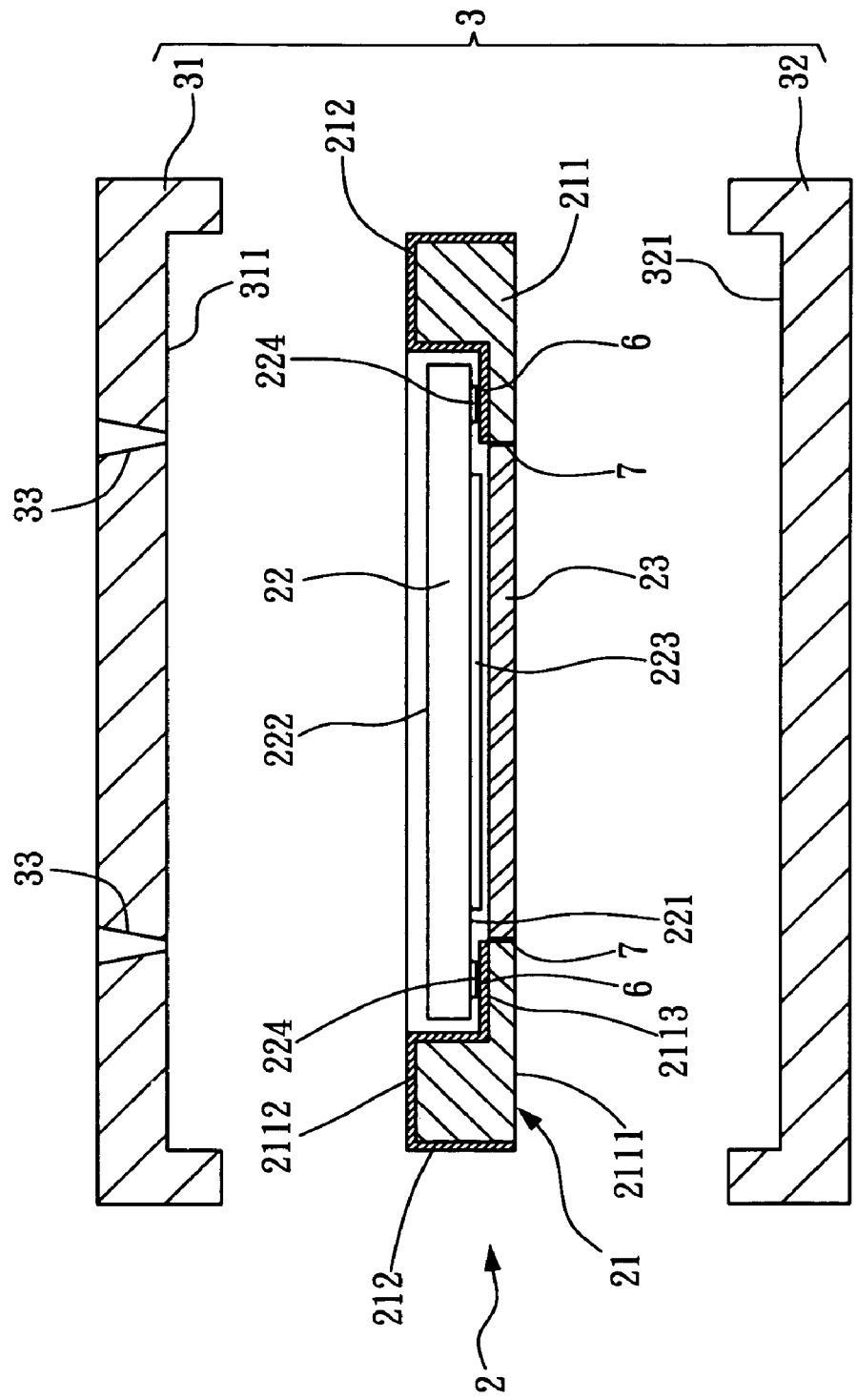
FIGS. 6A and 6B are exploded and assembled sectional views, respectively, of a packaging mold for packaging the packaging device according to the first preferred embodiment of the present invention.
Figure 6B:
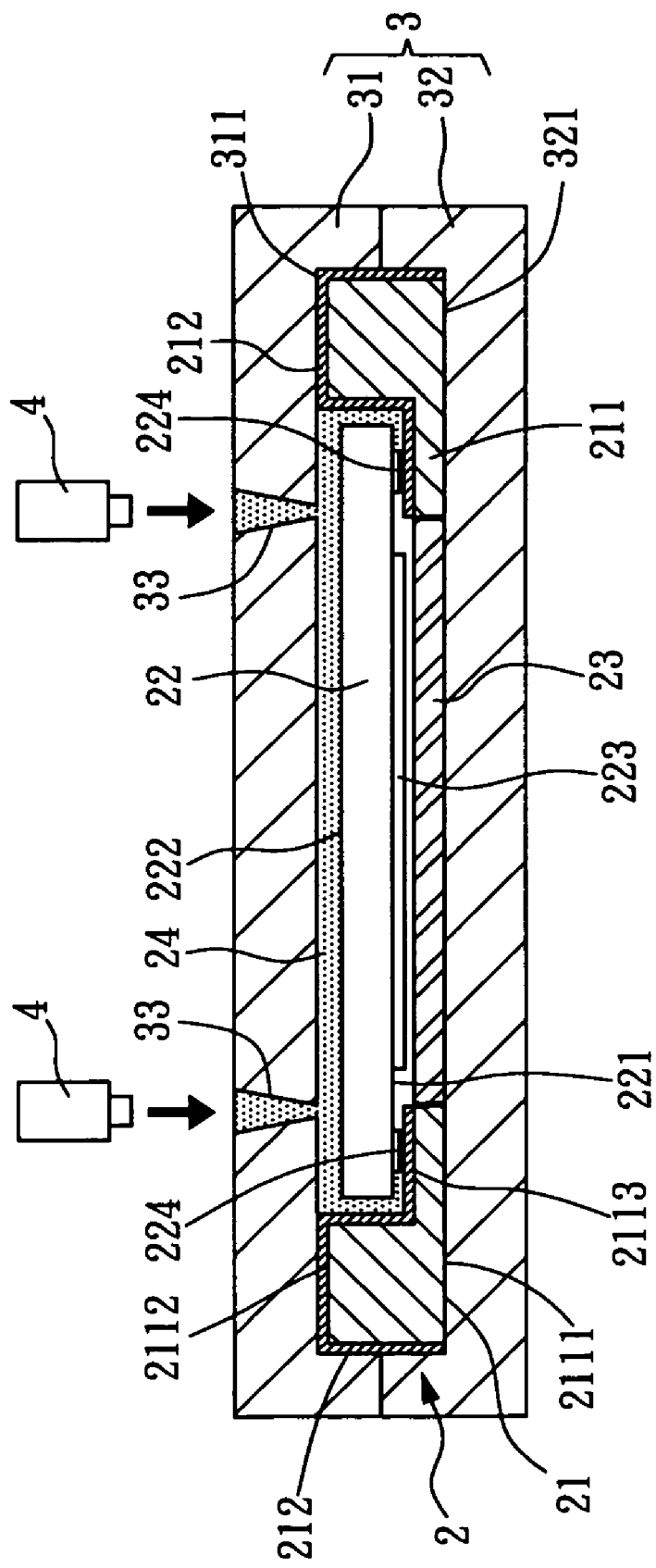

FIGS. 6A and 6B show a packaging mold 3 for packaging the packaging device 2. The packaging mold 3 includes a first mold 31 and a second mold 32. The first and second molds 31, 32 have a first mold cavity 311 and a second mold cavity 321, respectively. The image sensor 22 and the supporting seat 21 are received in the first and second mold cavities 311, 321. The packaging mold 3 is provided with at least one feed hole 33 through which at least one injection device (injection molding machine) 4 injects the insulating material 24 into the packaging mold 3, thereby filling the first and second mold cavities 311, 321 with the insulating material 24.

Hence, through an injection molding process using the packaging mold 3 and the at least one injection device 4, the packaging device 2 can be rapidly and precisely packaged for mass production in the following manner. To begin with, an unpackaged semi-product of the packaging device 2 is placed in the first and second molding cavities 311, 321 of the packaging mold 3. Then, the insulating material 24 is injected through the at least one feed hole 33 of the first mold 31 and through the first mold cavity 311 onto the inactive surface 222 of the image sensor 22 and eventually fills up the gap between the recessed step 2113 of the supporting seat 21 and the image sensor 22. Once the insulating material 24 is solidified, the packaging device 2 is released from the first and second molds 31, 32 of the packaging mold 3. Thus, the packaging process of the packaging device 2 is completed.

In the following preferred embodiments of the present invention, most of the elements are identical or similar to those in the previous embodiment; therefore, a detailed description of the same elements and structures is omitted for the sake of brevity. Hereinafter, the same elements are identified by the same names and reference numerals while similar elements are given the same names but are differentiated by an English letter suffixed to their original reference numerals. Those similar elements are not discussed repeatedly, either.

Figure 7A:
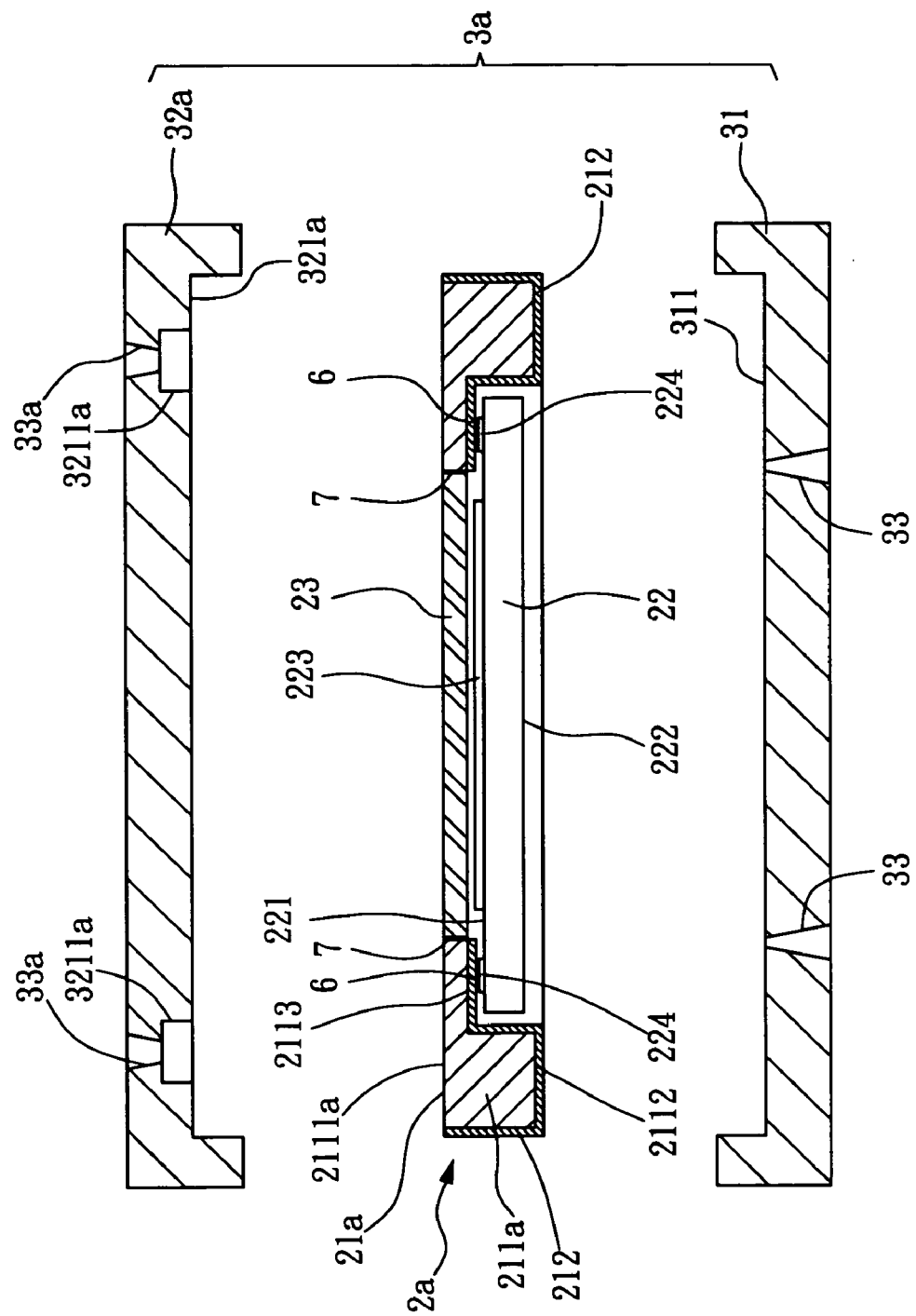
FIGS. 7A and 7B are exploded and assembled sectional views, respectively, of a packaging mold for packaging a packaging device according to a second preferred embodiment of the present invention.
Figure 7B:
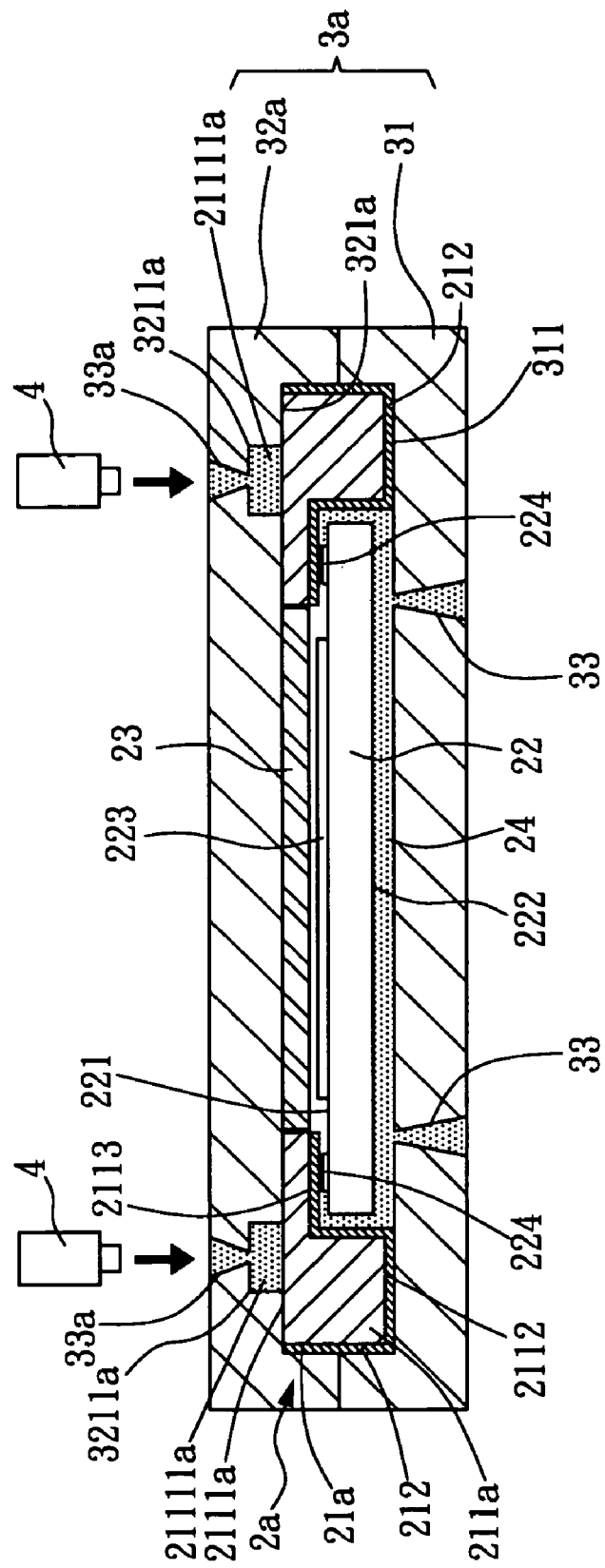

FIGS. 7A and 7B show a packaging device of an image sensor according to the second preferred embodiment of the present invention, along with a packaging mold for packaging the same. The packaging device and the packaging mold shown in FIGS. 7A and 7B are different from those described with reference to FIGS. 6A and 6B in the first preferred embodiment in that the second mold 32a for packaging the packaging device 2a is additionally provided with at least one feed hole 33a and that at least one groove 3211a is provided in the second mold cavity 321a, wherein the at least one feed hole 33a of the packaging mold 3a is in communication with the second mold cavity 321a. Thus, as shown in FIG. 7B, when the insulating material 24 is injected by the injection devices 4 into the second mold cavity 321a via the feed holes 33a of the second mold 32a, the insulating material 24 is fed into the grooves 3211a and forms projections 21111a on the first surface 2111a of the hollow frame 211a of the supporting seat 21a. The projections 21111a formed by the solidified insulating material 24 in the grooves 3211a are arranged on the first surface 2111a in such a way as to surround the periphery of the transparent cover plate 23.

Figure 8:
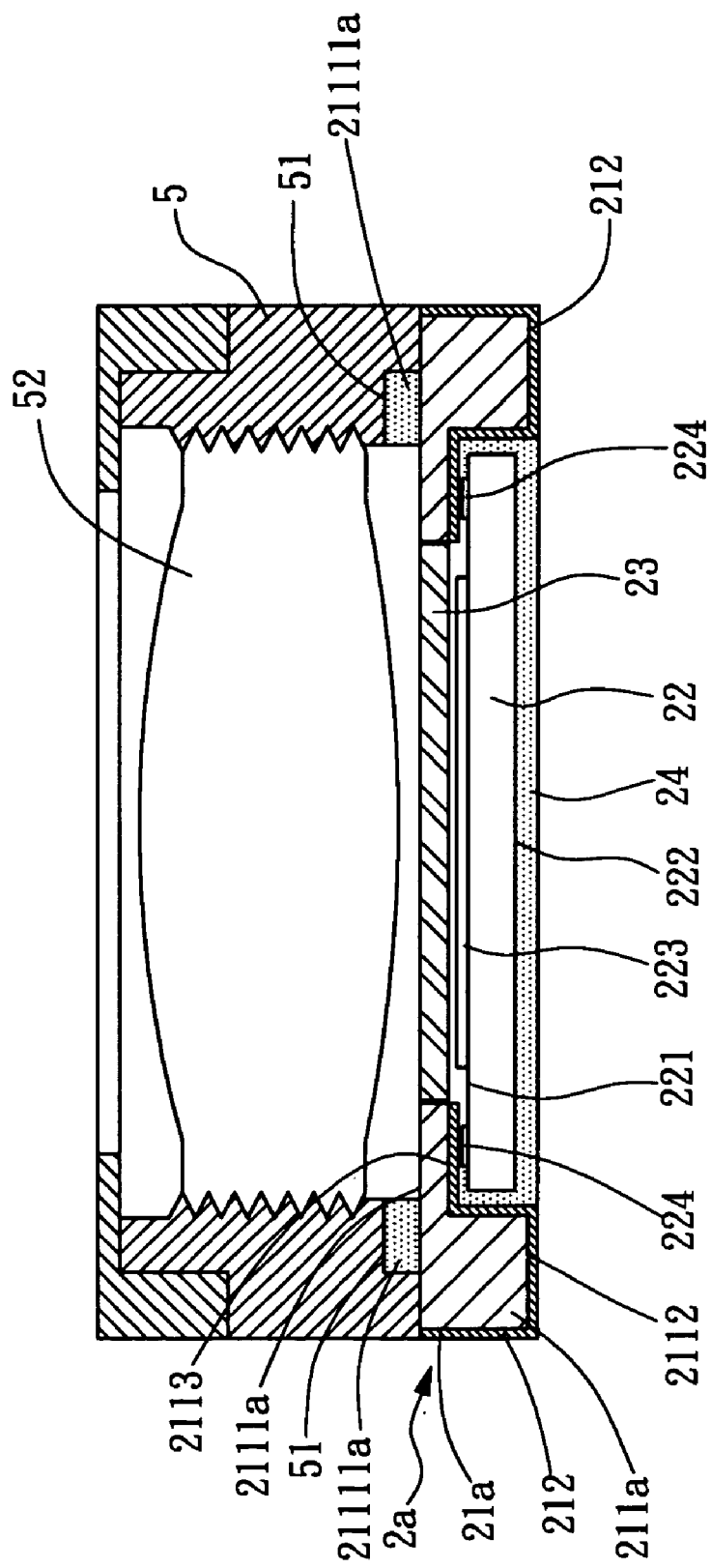
FIG. 8 is a sectional view showing the packaging device of the second preferred embodiment of the present invention connected with a lens module.

Referring to FIG. 8, a lens module 5 is coupled to the supporting seat 21a of the packaging device 2a of the second preferred embodiment with the assistance of the projections 21111a, which have a predetermined height and, as described above, are formed on the first surface 2111a of the supporting seat 21a by injecting the insulating material 24 into the grooves 3211a provided in the second mold cavity 321a (see FIG. 7B).

More specifically, when the lower portion of the lens module 5 is disposed on the first surface 2111a of the hollow frame 211a, the projections 21111a formed on the first surface 2111a are engaged with and therefore position a connecting end 51 in the lower portion of the lens module 5. In consequence, the axis of a lens set 52 installed in the lens module 5 precisely corresponds in position to the center of the image sensing region 223 of the image sensor 22. The engagement between the projections 21111a and the connecting end 51 allows the lens module 5 to be rapidly and precisely connected to and positioned with respect to the packaging device 2a while reducing the combined height of the lens module 5 and the packaging device 2a.

Figure 9A:
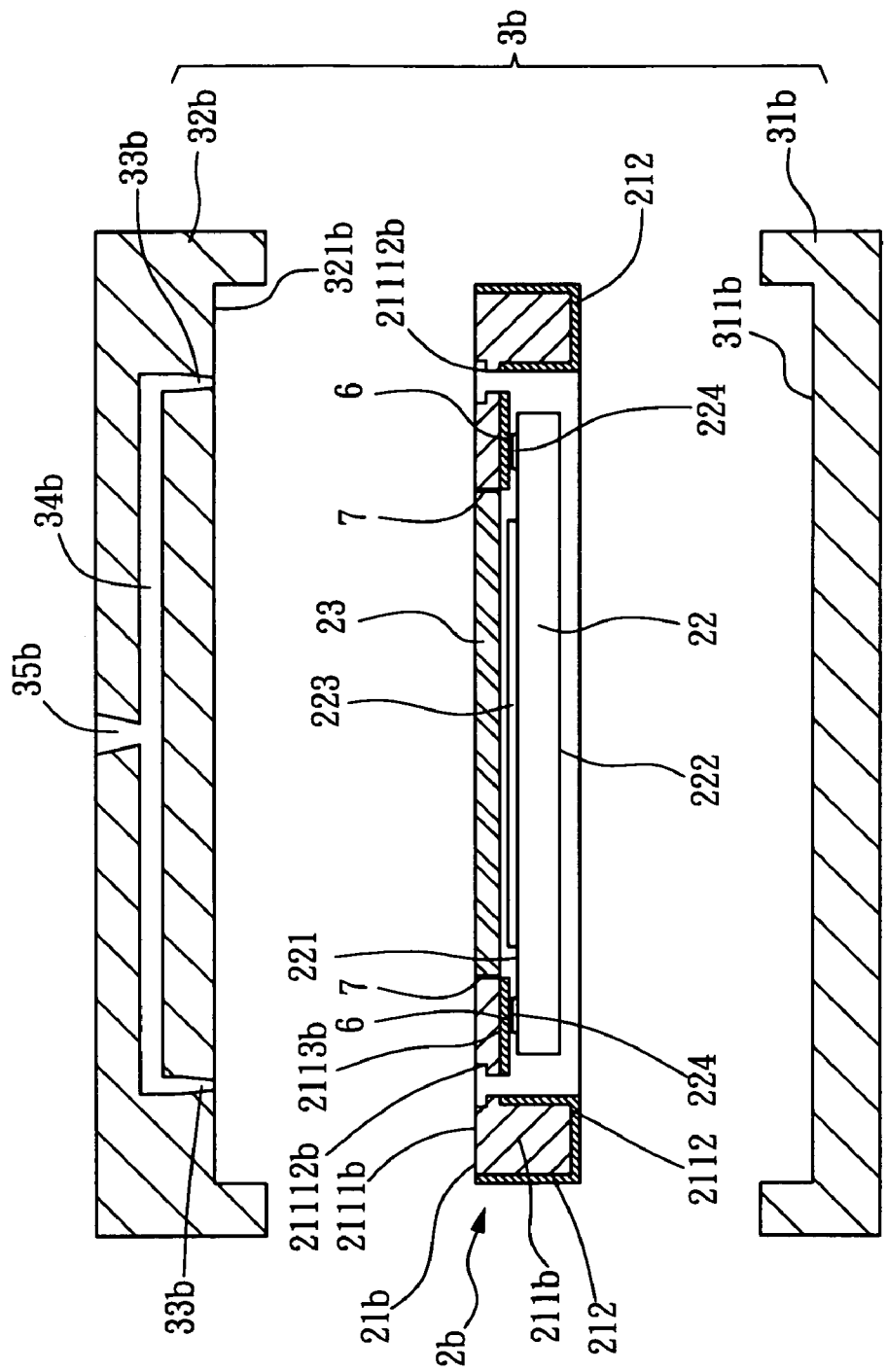
FIGS. 9A and 9B are exploded and assembled sectional views, respectively, of a packaging mold for packaging a packaging device according to a third preferred embodiment of the present invention.
Figure 9B:
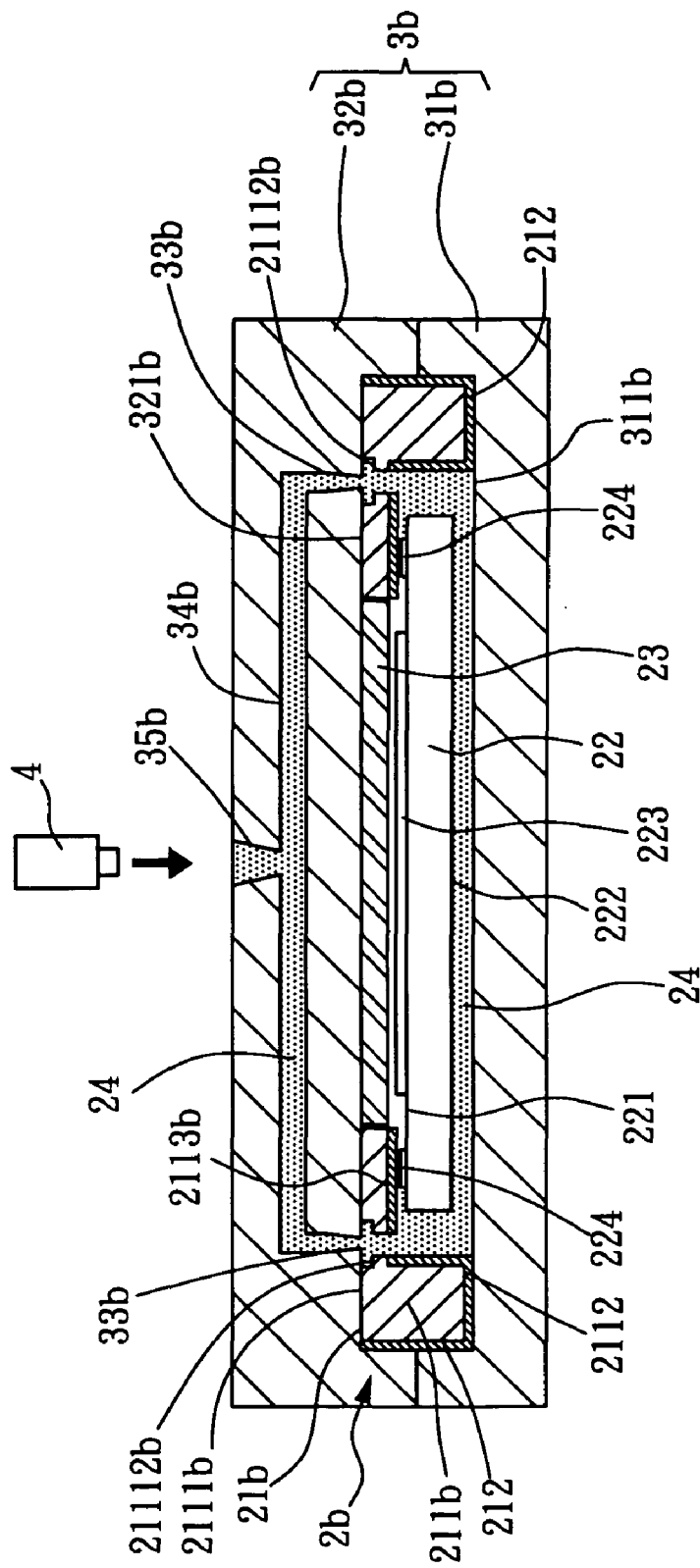

Please refer to FIGS. 9A and 9B for a packaging device of an image sensor according to the third preferred embodiment of the present invention and a packaging mold for packaging the same. The packaging device and the packaging mold shown in FIGS. 9A and 9B are different from those described with reference to FIGS. 7A and 7B in the second preferred embodiment in that at least one through hole 21112b is formed on the first surface 2111b of the supporting seat 21b of the packaging device 2b, wherein the at least one through hole 21112b corresponds in position to the at least one feed hole 33b of the second mold 32b, is rivet-shaped, and communicates with the recessed step 2113b of the supporting seat 21b. Thus, as shown in FIG. 9B, when the insulating material 24 is injected by the injection device 4 into the second mold cavity 321b via the feed holes 33b, the insulating material 24 flows to the recessed step 2113b of the supporting seat 21b through the through holes 21112b and enters the first mold cavity 311b, thereby covering the inactive surface 222 of the image sensor 22 and filling the gap between the recessed step 2113b of the supporting seat 21b and the image sensor 22 while filling up the through holes 21112b as well.

More specifically, each of the rivet-shaped through holes 21112b has two connected sections defined respectively by two different inner diameters, extends between the first surface 2111b and the recessed step 2113b of the hollow frame 211b, and is in communication with the first mold cavity 311b of the packaging mold 3b. Hence, while the packaging device 2b is packaged with the insulating material 24, the insulating material 24 passes through the through holes 21112b, enters the gap between the image sensor 22 and the recessed step 2113b, and then flows into the first mold cavity 311b. As a result, the inactive surface 222 of the image sensor 22 is covered by a layer of the insulating material 24, and the gap between the image sensor 22 and the recessed step 2113b is filled with the insulating material 24. The portions of the insulating material 24 that are solidified in the through holes 21112b are tightly engaged in the supporting seat 21b like rivets, thereby preventing the insulating material 24 covering the inactive surface 222 of the image sensor 22 from peeling off.

In addition, the packaging mold 3b includes an inner channel 34b and a general feed port 35b. The inner channel 34b is connected to all the feed holes 33b of the first mold 31b or of the second mold 32b, respectively, and communicates with the outside of the packaging mold 3b via the general feed port 35b. Thus, as shown in FIG. 9B, the insulating material 24 supplied by the injection device 4 flows to the inner channel 34b through the general feed port 35b and fills the first mold cavity 311b or the second mold cavity 321b of the packaging mole 3b via the feed holes 33b, thereby completing the packaging process of the packaging device 2b.

Figure 10A:
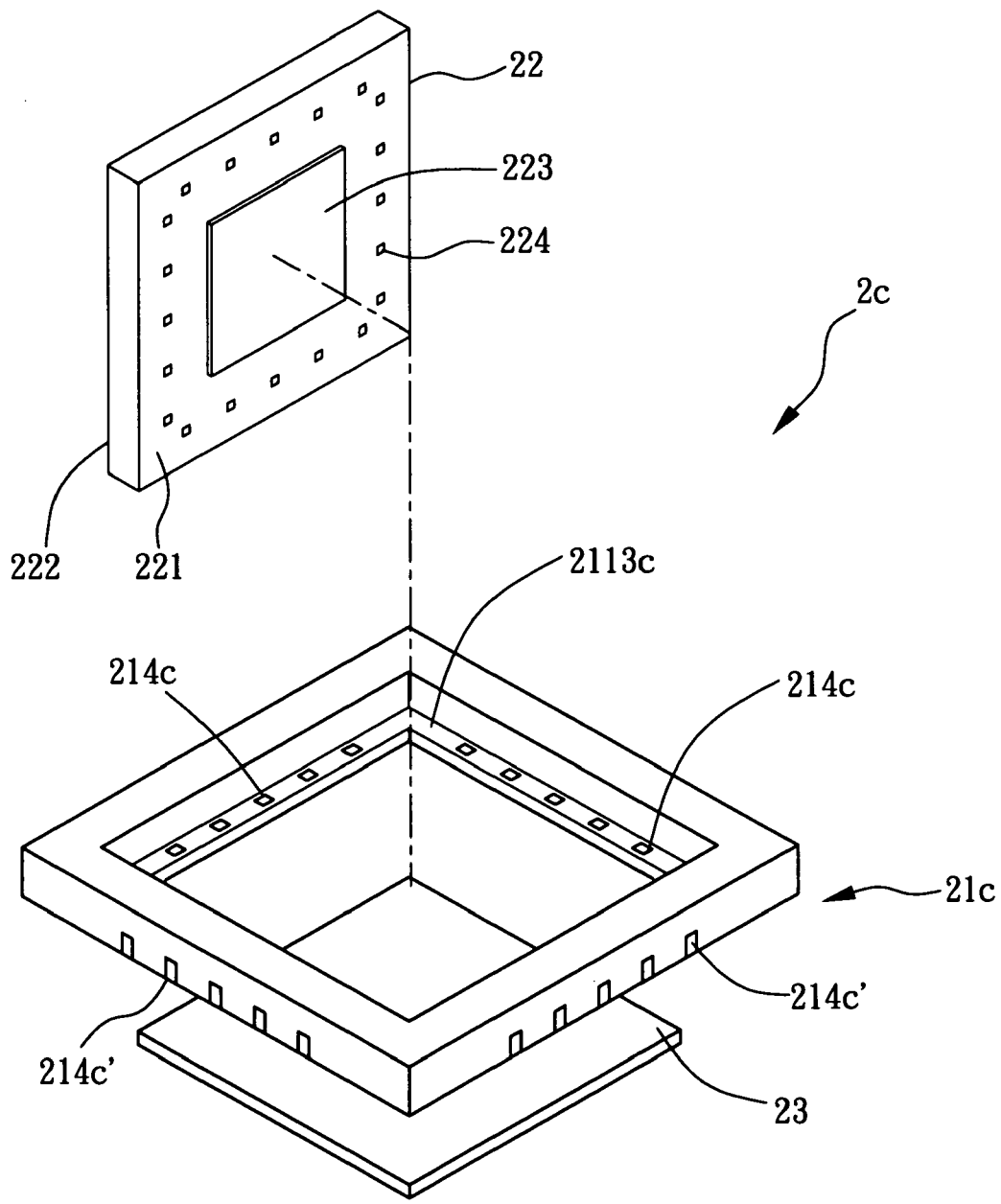
FIGS. 10A and 10B are perspective and sectional views, respectively, of a supporting seat according to a fourth preferred embodiment of the present invention.
Figure 10B:
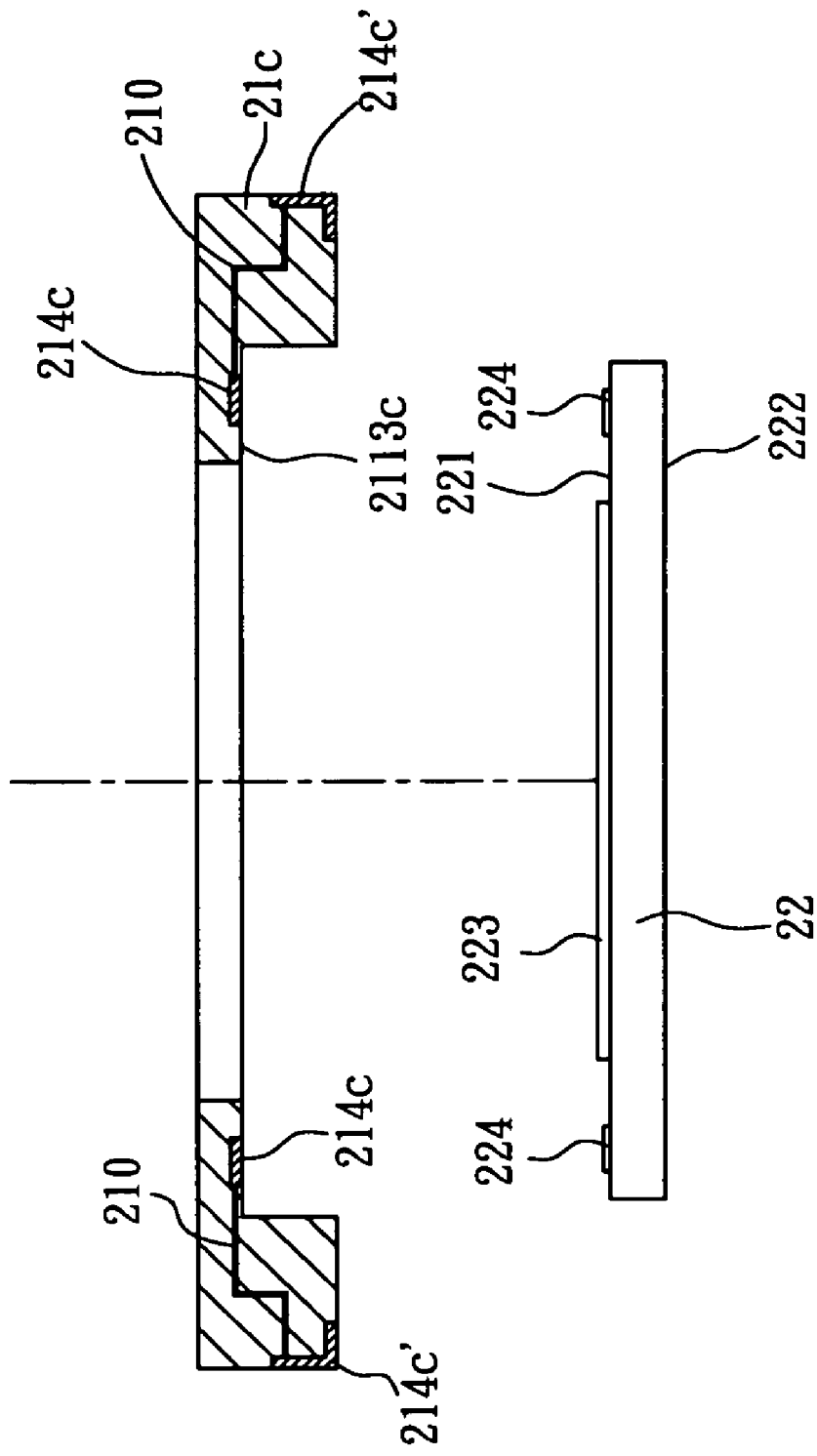

FIGS. 10A and 10B show a packaging device of an image sensor according to the fourth preferred embodiment of the present invention. The packaging device shown in FIGS. 10A and 10B is different from that described with reference to FIG. 2 in the first preferred embodiment in that the supporting seat 21c of the packaging device 2c is made of a multilayer printed circuit board (PCB). Moreover, the electrical connection structures in the present embodiment are the plural printed circuits 210 in the supporting seat 21c (i.e., the multilayer printed circuit board). With circuit loops formed by the multilayer wiring in the printed circuit board, the plural contacts 214c of the printed circuits 210 that are located in the recessed step 2113c are respectively and electrically connected to the plural contacts 214c' of the printed circuits 210 that are exposed on the outer periphery of the second surface of the supporting seat 21c. In turn, the contacts 214c of the printed circuits 210 that are located in the recessed step 2113c are respectively and electrically connected to the plural conductive ends 224 on the image sensor 22 by the conductive material 6.

The plural contacts 214c of the printed circuits 210 that are located in the recessed step 2113c and the contacts 214c' at the opposite ends of the printed circuits 210 that are located on the outer periphery of the supporting seat 21c are not limited in number or position. The circuit layout of the contacts 214c, 214c' is designed according to the number and position of the plural conductive ends 224 of the image sensor 22 and configured for preventing EMI.

Figure 11:
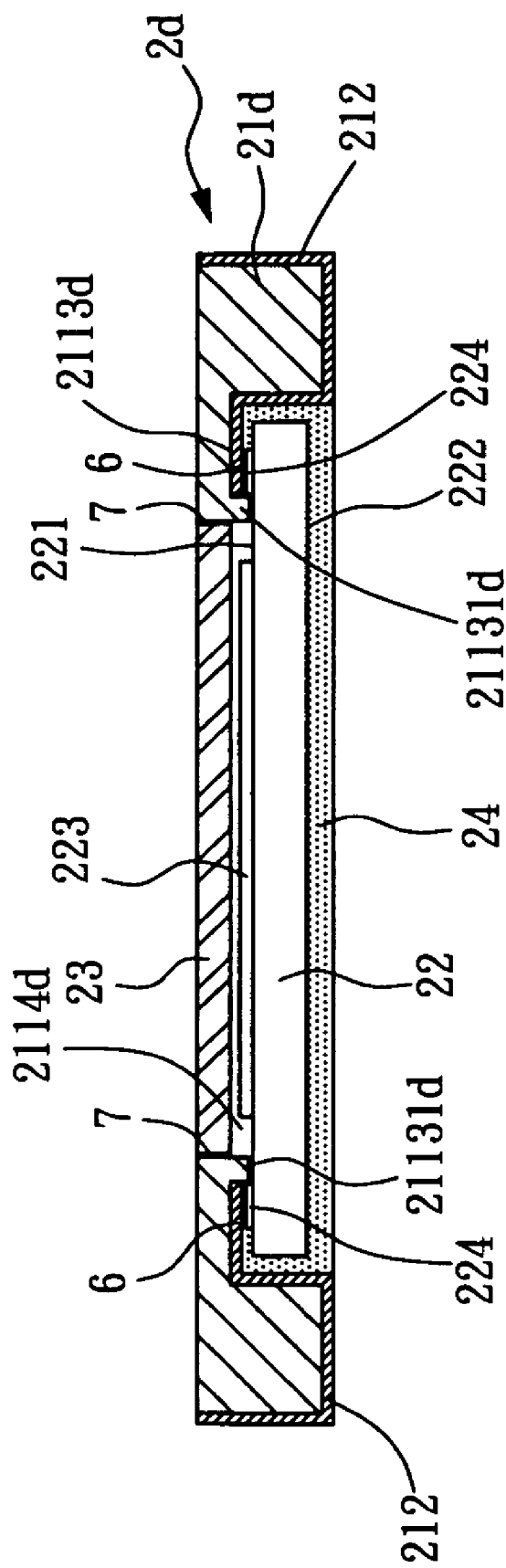
FIG. 11 is a sectional view of a packaging device according to a fifth preferred embodiment of the present invention.

Please refer to FIG. 11 for a packaging device of an image sensor according to the fifth preferred embodiment of the present invention. The packaging device shown in FIG. 11 is different from that described with reference to FIG. 4 in the first preferred embodiment in that the recessed step 2113d of the supporting seat 21d of the packaging device 2d is protrudingly provided with a spacer end 21131d. The spacer end 21131d surrounds the periphery of the hollow portion 2114d and is configured for separating the insulating material 24 on the recessed step 2113d from the image sensing region 223 of the image sensor 22. Thus, during the packaging process, the insulating material 24 is prevented from entering the area immediately below the transparent cover plate 23 and contaminating the image sensing region 223. The provision of the spacer end 21131d increases and ensures the yield of the packaging process.

In short, in the packaging device 2 of the present invention, the active surface 221 of the image sensor 22 is set on the recessed step 2113 of the supporting seat 21 by a flip-chip packaging technique such that the plural conductive ends 224 of the image sensor 22 are electrically connected to the plural contacts at one ends of the electrical connection structures that are bent and extended to the recessed step 2113. The inactive surface 222 of the image sensor 22 is covered and sealed by the insulating material 24. The gap between the recessed step 2113 of the supporting seat 21 and the image sensor 22 is filled up by the insulating material 24 to protect the image sensor 22 while preventing static electricity, electromagnetic interference, and leakage of light. In addition, the overall height of the packaging device 2 is also reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A packaging device of an image sensor, comprising:
a supporting seat formed as a hollow frame of a predetermined thickness, the supporting seat having a first surface and a second surface, the hollow frame of the supporting seat having an inner edge receding from the second surface toward the first surface to form a recessed step, the supporting seat provided with a plurality of electrical connection structures for providing electrical connection between a plurality of contacts provided in the recessed step and a plurality of contacts provided on an outer periphery of the supporting seat;

at least a through hole formed on the first surface, being rivet-shaped, communicated with the recessed step, further having two connected sections defined respectively by two different inner diameters and extended between the first surface and the recessed step;

the image sensor having an active surface and an inactive surface, wherein the active surface of the image sensor enters the supporting seat through the second surface and is placed on the recessed step of the supporting seat such that a plurality of conductive ends peripherally provided on the active surface are electrically connected to the electrical connection structures on the recessed step;

a transparent cover plate provided on a side of the image sensor where the active surface is located; and an insulating material for covering the inactive surface of the image sensor and filling a gap between the recessed step of the supporting seat and the image sensor, also filling up the at least a through hole so as to be solidified in the at least a through hole to be tightly engaged in the supporting seat like a rivet for preventing the insulating material from peeling off.

2. The packaging device of claim 1, wherein the transparent cover plate is one of infrared filter glass, plain glass, anti-reflection glass, and blue glass; electrical connection between the active surface and the conductive ends of the image sensor is implemented by one of conductive adhesive, solder paste, and solder balls; the supporting seat is made of one of glass reinforced epoxy, polyimide, resin, poly(p-phenylene oxide), and a ceramic substrate; and the transparent cover plate is bonded by a bonding agent to one of the first surface of the supporting seat and a hollow portion centrally provided on the first surface of the supporting seat.

3. The packaging device of claim 1, wherein the electrical connection structures are metal leads, the supporting seat coupled with the metal leads by casting or injection molding, and wherein the recessed step has a vertical depth greater than or equal to a thickness of the image sensor.

4. The packaging device of claim 1, wherein the packaging device is packaged by a packaging mold comprising a first mold having a first mold cavity and a second mold having a second mold cavity, the image sensor and the supporting seat being received in the first and second mold cavities, the packaging mold provided with at least a feed hole through which an injection device injects the insulating material into the packaging mold.

5. The packaging device of claim 4, wherein the at least a feed hole is provided on the first mold, communicates with the first mold cavity, and corresponds in position to the recessed step of the supporting seat, so as for the insulating material injected by the injection device to enter the first mold cavity through the at least a feed hole, cover the inactive surface of the image sensor, and fill the gap between the recessed step of the supporting seat and the image sensor.

6. The packaging device of claim 5, wherein the at least a feed hole is provided on the first mold and the second mold and in communication with the first mold cavity and the second mold cavity, respectively, the second mold cavity provided therein with at least a groove such that, when the insulating material injected by the injection device enters the second mold cavity through the feed hole(s) of the second mold, at least a projection is formed on the first surface of the supporting seat, the at least a projection surrounding a periphery of the transparent cover plate.

7. The packaging device of claim 6, wherein the at least a through hole, is corresponding in position to the feed hole(s) of the second mold, such that, when the insulating material injected by the injection device enters the second mold cavity through the feed hole(s) thereof, the insulating material passes through the at least a through hole and flows onto the recessed step of the supporting seat and into the first mold cavity, thereby covering the inactive surface of the image sensor, filling the gap between the recessed step of the supporting seat and the image sensor, and filling up the at least a through hole.

8. The packaging device of claim 1, wherein the packaging device is connected with a lens module, the lens module disposed on the first surface of the hollow frame, the first surface formed with a projection for engaging with and positioning a connecting end in a lower portion of the lens module such that an axis of a lens set installed in the lens module corresponds in position to a center of an image sensing region of the image sensor.

9. The packaging device of claim 1, wherein the electrical connection structures are composed of a plurality of metal leads formed by stamping or etching a thin metal plate, each said metal lead having an end bent and embedded in the recessed step of the supporting seat and serving as a contact for electrical connection with the image sensor, each said metal lead having an opposite end bent and embedded in an outer periphery of the second surface of the supporting seat and configured for electrical connection with an external electronic device.

10. The packaging device of claim 1, wherein the supporting seat is a printed circuit board, and the electrical connection structures are composed of plural layers of printed circuits in the printed circuit board.

11. The packaging device of claim 1, wherein the recessed step of the supporting seat is protrudingly provided with a spacer end for separating the insulating material on the recessed step from an image sensing region of the image sensor and thereby preventing the insulating material from entering and contaminating the image sensing region.

* * * * *